(12) United States Patent
Motoki

(10) Patent No.: US 12,425,778 B2
(45) Date of Patent: Sep. 23, 2025

(54) SEMICONDUCTOR INTEGRATED CIRCUIT DEVICE AND MICROPHONE MODULE USING SAME

(71) Applicant: NISSHINBO MICRO DEVICES INC., Tokyo (JP)

(72) Inventor: Naoyuki Motoki, Fujimino (JP)

(73) Assignee: NISSHINBO MICRO DEVICES INC., Tokyo (JP)

( * ) Notice: Subject to any disclaimer, the term of this patent is extended or adjusted under 35 U.S.C. 154(b) by 370 days.

(21) Appl. No.: 18/248,718

(22) PCT Filed: Oct. 28, 2021

(86) PCT No.: PCT/JP2021/039785
§ 371 (c)(1),
(2) Date: Apr. 12, 2023

(87) PCT Pub. No.: WO2022/092187
PCT Pub. Date: May 5, 2022

(65) Prior Publication Data
US 2023/0396933 A1 Dec. 7, 2023

(30) Foreign Application Priority Data
Oct. 29, 2020 (JP) .................. 2020-181647

(51) Int. Cl.
*H04R 19/04* (2006.01)
*H04R 3/00* (2006.01)
*H04R 19/00* (2006.01)

(52) U.S. Cl.
CPC ........... *H04R 19/04* (2013.01); *H04R 19/005* (2013.01); *H04R 2201/003* (2013.01); *H04R 2410/03* (2013.01)

(58) Field of Classification Search
CPC .................. H04R 19/04; H04R 19/005; H04R 2201/003; H04R 2410/03; H04R 3/00
(Continued)

(56) References Cited

U.S. PATENT DOCUMENTS

2011/0158435 A1 6/2011 Ono et al.
2015/0125003 A1 5/2015 Wiesbauer et al.
(Continued)

FOREIGN PATENT DOCUMENTS

JP 2011139415 A 7/2011
JP 2015523764 A 8/2015
(Continued)

OTHER PUBLICATIONS

International Preliminary Report on Patentability issued May 11, 2023, in connection with international application No. PCT/JP2021/039785 from the Japanese Patent Office.
(Continued)

*Primary Examiner* — Thjuan K Addy
(74) *Attorney, Agent, or Firm* — Elizabeth L. Neal; De Witt LLP

(57) ABSTRACT

A semiconductor integrated circuit device capable of inputting a signal of a MEMS transducer 2 includes: a power supply circuit 11 for the MEMS transducer 2; an input amplifier 12 for inputting and amplifying a signal of the MEMS transducer 2; a line driver 13 for amplifying an output from the input amplifier 12 and allowing for driving of a load connected to an output terminal T3, the line driver 13 having an input terminal; and the output terminal T3 for outputting an output of the line driver 13, wherein the power supply circuit 11, the input amplifier 12, and the line driver 13 are integrally formed on a semiconductor substrate, and wherein a gain setting circuit 14 for determining gain of the line driver 13 and a DC potential of the output terminal T3 is connected to the input terminal of the line driver 13.

15 Claims, 6 Drawing Sheets

(58) Field of Classification Search
USPC .......................... 381/111, 115, 122, 117, 150
See application file for complete search history.

(56) References Cited

U.S. PATENT DOCUMENTS

| | | |
|---|---|---|
| 2015/0131812 A1 | 5/2015 | Schober et al. |
| 2016/0133271 A1 | 5/2016 | Kuntzman |
| 2016/0134975 A1 | 5/2016 | Kuntzman et al. |
| 2017/0029272 A1* | 2/2017 | Ren .................... B81C 1/00801 |
| 2017/0164118 A1 | 6/2017 | Wiesbauer et al. |
| 2018/0034431 A1 | 2/2018 | Rocca et al. |

FOREIGN PATENT DOCUMENTS

| | | | |
|---|---|---|---|
| JP | 2016123028 A | 7/2016 | |
| JP | 2018511219 A | 4/2018 | |
| JP | 2019204987 A | 11/2019 | |

OTHER PUBLICATIONS

International Search Report issued Dec. 3, 2021, in connection with international application No. PCT/JP2021/039785 from the Japanese Patent Office.

Office Action issued Apr. 15, 2025, from the Japanese Patent Office in connection with related JP Patent Application No. 2022-559223.

Office Action issued Jun. 24, 2025, from the Japanese Patent Office in connection with related JP Patent Application No. 2022-559223.

* cited by examiner

SEMICONDUCTOR INTEGRATED CIRCUIT DEVICE AND MICROPHONE MODULE USING SAME

CROSS-REFERENCE TO RELATED APPLICATIONS

The present application is the U.S. National Stage application of International Application No. PCT/JP2021/039785, filed Oct. 28, 2021, which International Application was published on May 5, 2022, as International Publication No. WO2022/092187. The International Application claims priority to Japanese Patent Application No. 2020-181647, filed Oct. 29, 2020, the contents of which are incorporated herein by reference in their entireties.

TECHNICAL FIELD

The present disclosure relates to a semiconductor integrated circuit device that uses an output of a MEMS transducer as a signal source and a microphone module using the semiconductor integrated circuit device.

BACKGROUND ART

A conventional in-vehicle microphone (microphone unit), generally as shown in FIG. 12, consists of a MEMS transducer microphone module 82 consisting of a MEMS transducer and an amplifier; a regulator 81 for supplying a bias voltage to the MEMS transducer microphone module 82; a two-wire type line driver 83; and a gain adjustment circuit 84 for adjusting gain of the two-wire type line driver 83 (see, for example, Patent Document 1).

Here, when the MEMS transducer microphone module is used as a microphone module, the power supply voltage is generally about 3.3 V at maximum. However, when it is used for a vehicle, the maximum voltage as the microphone is about 8 V. Therefore, peripheral components such as the regulator 81 are required for operating the MEMS transducer microphone module. Moreover, since gain accuracy is strictly required for use in applications such as noise cancellation, it is necessary to use a gain-controlled MEMS transducer microphone module. Furthermore, in order to adjust gain after assembling the microphone unit, it is necessary to make an adjustment such as by using a trimmer resistance mechanically or using a resistance on a substrate subjected to trimming with a laser.

Therefore, in the in-vehicle microphone, individual components are used for the aforementioned regulator 81, MEMS transducer microphone module 82, two-wire type line driver 83, and gain adjustment circuit 84, respectively, and the in-vehicle microphone has a structure in which these components are arranged on the substrate and assembled while adjusting characteristics such as gain. Besides, in FIG. 12, 85 denotes a phantom power supply, $R_L$ denotes an output load resistance, and OUT denotes a signal output.

PRIOR ART DOCUMENT

Patent Document

Patent Document 1: JP 2018-511219 A

SUMMARY OF THE INVENTION

Problem to be Solved by the Invention

When each individual component is arranged on a substrate as described above, a RF noise RFN as shown in FIG. 12 is easy to superimpose on a wiring between parts connecting each component. Therefore, it is necessary to take measures such as connecting a filter for removing the RF noise between each component, which is not shown in the figures. As a result, the number of parts increases, and further in a configuration in which each part is assembled on the substrate, an increase in mounting area cannot be avoided. Furthermore, there is a problem that the number of assembling steps for gain adjustment and the like increases, leading to a substantial increase in cost.

Here, it is an object of the present disclosure to provide a semiconductor integrated circuit device that uses an output of a MEMS transducer as a signal source, and a microphone module using the semiconductor integrated circuit device, the semiconductor integrated circuit device being capable of simplifying assembly of the microphone module that is not easily affected by a RF noise.

Means to Solve the Problem

In one aspect of the present disclosure, the semiconductor integrated circuit device comprises: a power supply circuit for a MEMS transducer; an input amplifier for inputting and amplifying a signal of the MEMS transducer; a line driver for amplifying an output from the input amplifier and allowing for driving of a load connected to an output terminal; and the output terminal for outputting an output of the line driver, wherein the power supply circuit, the input amplifier, and the line driver are integrally formed on a semiconductor substrate, and wherein a gain setting circuit for determining gain of the line driver and a DC potential of the output terminal is connected to an input terminal of the line driver.

In another aspect of the present disclosure, the semiconductor integrated circuit device comprises: a power supply circuit for a MEMS transducer; an input amplifier for inputting and amplifying a signal from the MEMS transducer; a line driver for amplifying an output from the input amplifier and allowing for driving of a load connected to an output terminal; and the output terminal for outputting an output from the line driver, wherein the power supply circuit, the input amplifier, and the line driver are integrally formed on a semiconductor substrate, and wherein an external terminal is provided between an output terminal of the input amplifier and an input terminal of the line driver so that a filter can be connected thereto and gain of the line driver can be set externally.

Effects of the Invention

According to the semiconductor integrated circuit device of the present disclosure, since the input amplifier and the line driver are integrated into a monolithic IC, it is difficult for the RF noise to superimpose between each element, and it is not necessary to form a filter for noise removal between each element. In addition, since the gain setting circuit of the line driver is connected to the input terminal of the line driver or the external terminal is provided so that gain of the line driver can be set externally, the line driver is allowed for heavy-load driving that requires a high withstand voltage for vehicle. Furthermore, since the input amplifier and the line driver are formed into one chip, they are formed to be very small in size, and when they are applied into a microphone module, they may be formed with an exclusive area of about half of that in the conventional microphone module. As a result, a high-performance, low-cost in-vehicle microphone can be obtained.

EMBODIMENT FOR CARRYING OUT THE INVENTION

Next, embodiments of the semiconductor integrated circuit device of the present disclosure and the microphone module using the same will be described with reference to the drawings, but the present disclosure is not limited to these embodiments.

Embodiment 1

Figure 1:
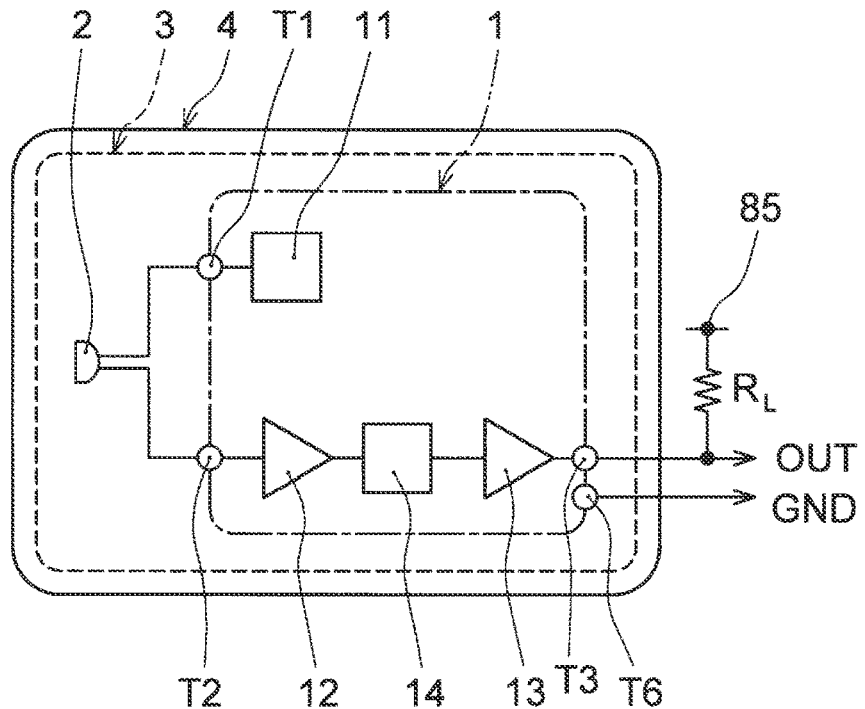
FIG. 1 is a block diagram of a basic structure of one embodiment (Embodiment 1) of a semiconductor integrated circuit device of the present disclosure.

As shown in FIG. 1, one embodiment (Embodiment 1) of the semiconductor integrated circuit device 1 of the present disclosure comprises: a power supply circuit 11 for a MEMS transducer 2 which is connected to the MEMS transducer 2 via an external terminal T1; an input amplifier 12 for inputting and amplifying a signal of the MEMS transducer 2 from an external terminal T2; and a line driver 13 for amplifying an output of the input amplifier 12 and allowing for driving of a load connected to an output terminal T3. In addition, the power supply circuit 11, the input amplifier 12, and the line driver 13 are integrally formed on a semiconductor substrate (not shown), and a gain setting circuit 14 for determining gain of the line driver 13 and a DC potential of the output terminal T3 is formed with connecting to an input terminal of the line driver 13. In this case, the gain setting circuit 14 is also formed integrally on the semiconductor substrate.

That is, the semiconductor integrated circuit device of this Embodiment 1 is a semiconductor integrated circuit device suitable for a microphone using a MEMS transducer, particularly an in-vehicle microphone. As previously mentioned, the in-vehicle microphone requires a withstand voltage of at least 12 V for in-vehicle components, and requires a line driver allowing for heavy-load driving (low impedance driving such as 600Ω). Conventionally, an individual amplifier, power supply circuit, and line driver are hybridized on a substrate, but when hybridization is performed on the substrate, as previously mentioned, a route on which RF noise superimposes is created in a wiring that connects the separate parts, and therefore it is necessary to take countermeasures such as connecting a filter for removing a RF noise to each of them, which leads to a problem that the size of the microphone module is increased and the number of assembling steps is increased, resulting in an increase in cost.

The semiconductor integrated circuit device 1 of this Embodiment 1 is characterized by incorporating a gain setting circuit 14 for adjusting gain of the line driver 13 and determining a DC potential of the output terminal T3. As will be described later, it is characterized by being a one-chip semiconductor integrated circuit device incorporating a line driver 13 in accordance with a load connected to the output terminal T3, etc., a gain setting circuit 14, an input amplifier 12, and a power supply circuit 11, by forming the gain setting circuit 14 shown in FIG. 1 so as to make an adjustment externally.

The power supply circuit 11 supplies a bias voltage for the MEMS transducer 2. That is, an operating voltage of the MEMS transducer 2 is, for example, about 12 V, while a power supply voltage supplied to the semiconductor integrated circuit device 1 is about 3.3 V. Therefore, it is necessary to set the voltage suitable for the MEMS transducer 2, and the power supply circuit 11 is a circuit for adjusting the voltage. An output of this power supply circuit 11 is supplied to the MEMS transducer 2 via the external terminal T1.

The input amplifier 12 is for amplifying a signal of the MEMS transducer 2 since the signal is very small. The signal of this MEMS transducer 2 is input via the external terminal T2 to be amplified. The amplification factor can also be adjusted externally by connecting a gain adjustment circuit 15 (see FIG. 3), as in an example which will be described later.

The line driver 13 is configured to drive a heavy load connected to the output terminal T3 as previously mentioned. For example, a normal operational amplifier can also be used. In addition, the gain setting circuit 14 connected to the input terminal of the line driver 13 is used to adjust the output of the line driver 13. Besides, if the line driver 13 is of a two-wire type, it is not shown that the output of the line driver 13 is output by an open-drain output of an FET, in which the ground GND and a source are connected, which is provided on this output terminal side, which is not shown in the figures. If it is of a three-wire type which will be described later, a push-pull output is adopted.

Figure 7:
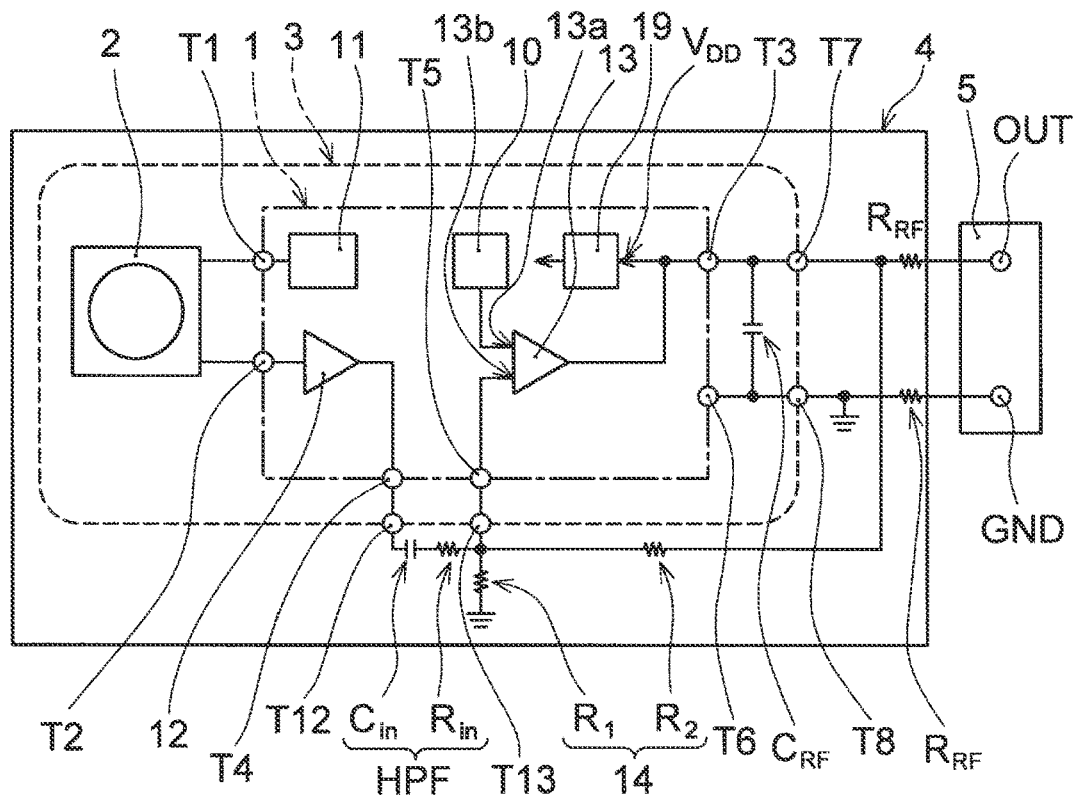
FIG. 7 is a block diagram showing a specific configuration example of FIG. 2.

The gain setting circuit 14 is for providing with an output such that the line driver 13 can drive a load connected to the output, making an adjustment so as to have a desired gain and a desired DC potential at the output terminal T3. Specifically, for example, as shown in FIG. 7, the gain setting circuit 14 is composed of a first resistor $R_1$ connected between a second input terminal 13b and the ground GND of the line driver 13 and a second resistor $R_2$ connected between the second input terminal 13b and the output terminal T3 of the line driver 13. By connecting such resistors $R_1$ and $R_2$, a gain $G_v$ of the line driver 13 is obtained by $G_v = R_2/R_1$, and a DC potential $V_{dc}$ of the output terminal T3 is obtained by $V_{dc} = V_{ref} \times (1 + R_2/R_1)$. $V_{ref}$ denotes a voltage input to a first input terminal 13a of the line driver 13 as a reference potential (see 10 in FIG. 7). Therefore, by adjusting first and second resistance values of the first and second resistors $R_1$, $R_2$, a desired load can be matched. As such, the amplification factor of the line driver can be easily adjusted with a ratio between the first resistance value and the second resistance value, and the DC potential of the output can be adjusted.

Figure 11:
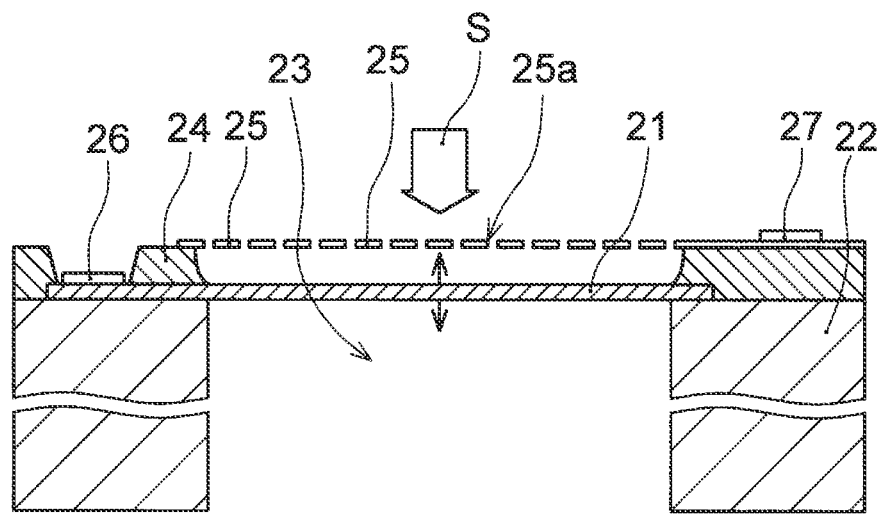
FIG. 11 is a cross-sectional view showing a structural example of a MEMS transducer.
Figure 12:
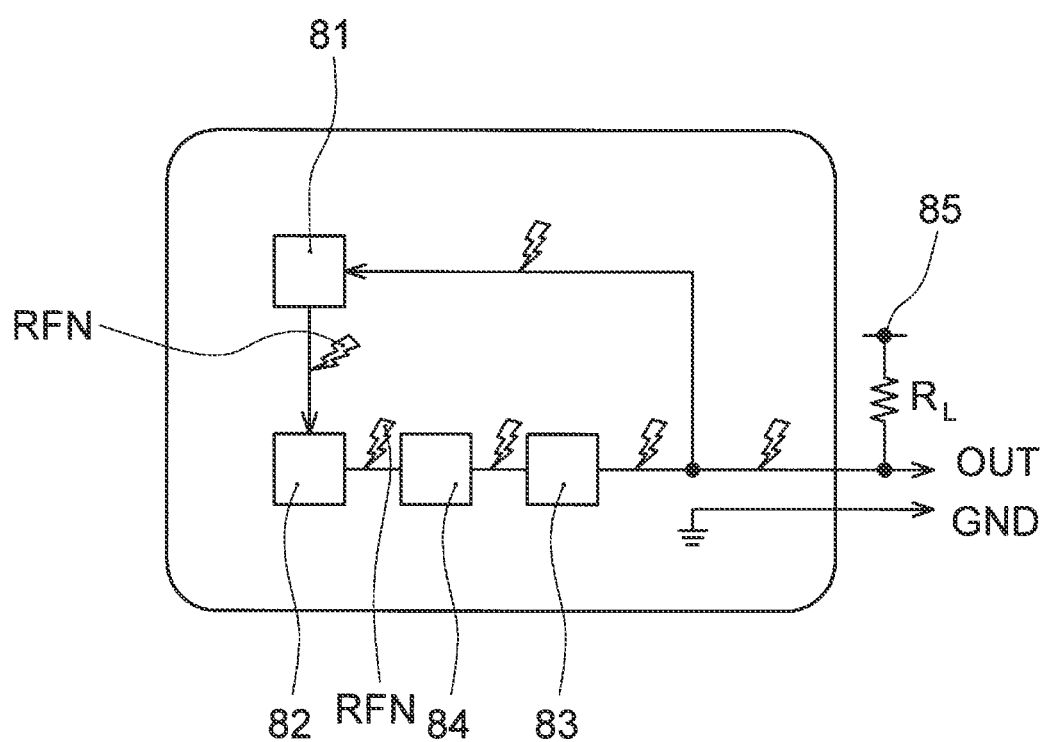
FIG. 12 is a block diagram showing a configuration of a conventional microphone module.

The MEMS transducer 2 has a structure in which a cross section of an example thereof is shown in FIG. 11, for example. That is, a membrane 21 is arranged on a concave part 23 of a semiconductor substrate 22, a back plate 25 is provided via a fixing member 24, and an opening 25*a* is formed on the back plate 25 so that a sound can pass through. In addition, electrodes 26, 27 are formed at one end of the membrane 21 and one end of the back plate 25, respectively. This configuration allows for a structure in which the sound S hits the membrane 21, thereby vibrating the membrane 21 and changing the capacitance between the membrane 21 and the back plate 25, and the capacitance change is detected by a pair of electrodes 26, 27.

The output terminal T3 is output (OUT) to a power supply terminal 85 via the load resistance $R_L$. Moreover, an external terminal T6 connected to the ground GND is formed. Besides, this output (OUT) acquisition via the load resistance $R_L$ is performed in the same manner as in FIGS. 5 to 7 and 9, which will be described later, but it is omitted in each figure. FIGS. 1 to 4 are examples in a case where the line driver 13 is of two-wire type, in which the power supply terminal 85 is connected to the phantom power supply.

In FIG. 1, 3 denotes a microphone module in which the semiconductor integrated circuit device 1 and the MEMS transducer 2 are arranged on a substrate (not shown), and 4 denotes a region of the microphone in which further necessary parts are connected to the microphone module 3 and which is covered by a housing.

Embodiment 2

In Embodiment 1 mentioned above, the gain setting circuit 14 of the line driver 13 is incorporated in the semiconductor integrated circuit device 1. In Embodiment 2, this gain setting circuit 14 is not incorporated, and a manufacturer can adjust the output of the line driver 13 at a stage of manufacturing a microphone 4, as will be described later. That is, Embodiment 2 corresponds to a case where this adjustment value differs depending on characteristics required for each automobile manufacturer using the microphone 4. Therefore, it has a structure in which an external component A including a filter and capable of setting gain of the line driver 13 can be arranged outside the semiconductor integrated circuit device 1 so that the output of the line driver 13 can be freely adjusted, in the stage of manufacturing the microphone 4. This external component A may be configured not to be affected by the RF noise, for example, by enclosing the gain setting circuit inside a noise reduction filter as will be described below.

Figure 2:
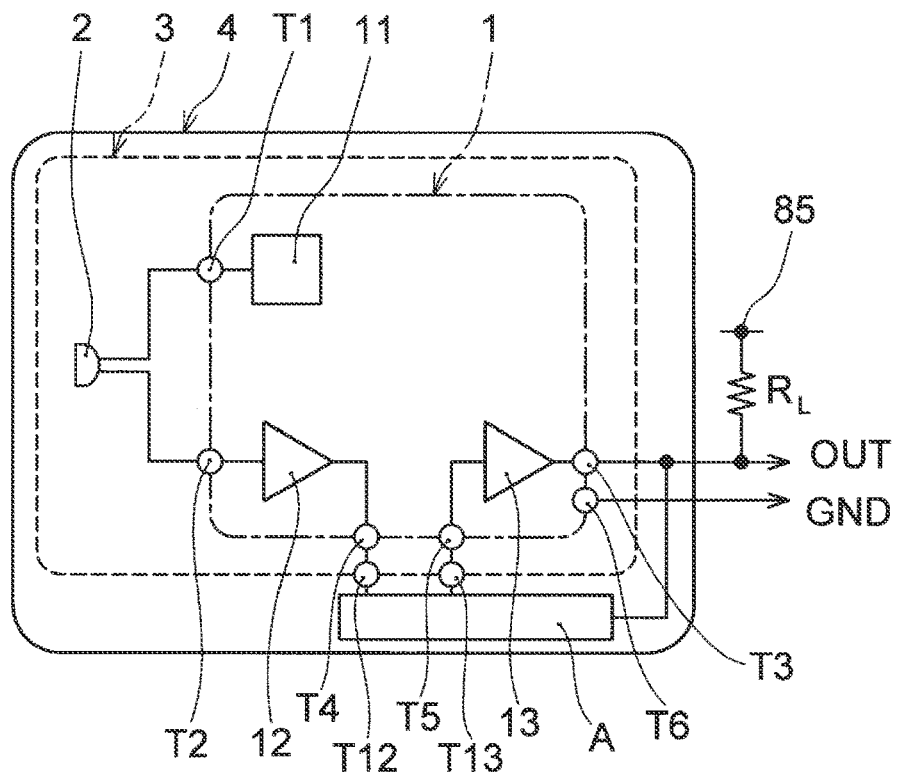
FIG. 2 is a block diagram of a basic structure of another embodiment (Embodiment 2) of the semiconductor integrated circuit device of the present disclosure.

Specifically, as shown in FIG. 2, the output terminal of the input amplifier 12 and the input terminal of the line driver 13 are formed as external terminals T4 and T5 of the semiconductor integrated circuit device 1, respectively, and the semiconductor integrated circuit device 1 has a structure in which the gain setting circuit 14 may be connected outside the semiconductor integrated circuit device 1. By forming such external terminals T4 and T5 for external connection in the semiconductor integrated circuit device 1, the output of the line driver 13 can be freely adjusted depending on required characteristics in a manufacturing step of the microphone module 3 or a manufacturing step of the microphone 4. For example, as shown in FIG. 2, the external terminals T4 and T5 of the semiconductor integrated circuit device 1 are connected to external terminals T12 and T13 of the microphone module 3, respectively, and the above-described external component A including the filter and the gain setting circuit is connected between these external terminals T12 and T13 and utilized for setting of gain of the line driver. Of course, the external component A is provided outside the microphone module 3 in FIG. 2, but it can also be provided inside the microphone module 3 and directly connected to the external terminals T4, T5. In this case, gain of the line driver can be adjusted in the manufacturing step of the microphone module 3 and can be further covered with a shield cover (see 31 in FIG. 10), and the filter can also be formed inside the microphone module 3. Besides, in FIG. 2, the same parts as in FIG. 1 are given the same reference numerals as in FIG. 1, and descriptions thereof are omitted.

EXAMPLE

Example 1

Figure 3:
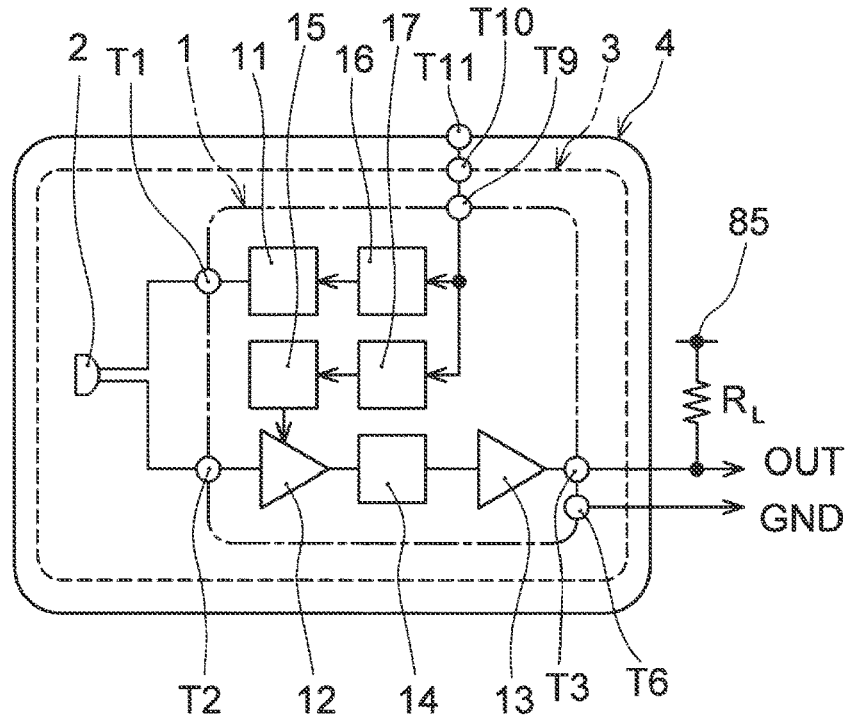
FIG. 3 is a block diagram of another basic structure in Embodiment 1.

In FIG. 3, the basic structure of FIG. 1 is provided with a gain adjustment circuit 15 for adjusting gain of the input amplifier 12, as well as a first memory element 16 for storing a voltage value optimally adjusted by a voltage adjustment circuit in the power supply circuit 11 and a second memory element 17 for storing the optimum gain adjusted by the gain adjustment circuit 15. Other configurations are the same as those in FIG. 1, and descriptions thereof are omitted. By providing the gain adjustment circuit 15, output after amplification can always be made constant even if there are variations in the MEMS transducer 2. Moreover, by storing the adjusted value of the power supply circuit 11 and the adjusted value of the gain adjustment circuit 15 in the first and second memory elements 16, 17, the semiconductor integrated circuit device 1 can be always operated at the optimum values without adjusting gain each time the device is used thereafter. Besides, in FIG. 3, T9 is a memory control terminal, which enables programming of the adjusted value after manufacturing of the semiconductor integrated circuit device 1. Furthermore, external terminals T10 and T11 can be provided when memory control is performed in the stage of manufacturing the microphone module 3 and in the stage of manufacturing the microphone 4.

This memory control terminal T9 is configured to control both the first memory element 16 and the second memory element 17 with one terminal. That is, for example, by inputting a predetermined start clock to the memory control terminal T9, the semiconductor integrated circuit device 1 is put into an active state, and then by inputting serial data of a predetermined number of bits (e.g., 8 bits) as a predetermined command, notification of control on whether writing or reading processing for which memory element is sent to each memory element. Then, in the case of reading, a change in potential of the memory control terminal T9 during a predetermined period (e.g., 8 clocks) is read as data (e.g., 8-bit serial data) indicating memory contents of the memory element of interest, and in the case of writing, a desired writing value is further input as serial data of a predetermined number of bits (e.g., 8 bits) after the data input as the command mentioned above. As such, by providing external terminals in common, the number of external terminals can be reduced, and intrusion of noise may be suppressed. Examples of providing the gain control circuit 15, the first memory element 16, the second memory element 17, etc. are not limited to Embodiment 1 shown in FIG. 1, and can be applied to other embodiments and examples. Besides, at a manufacturer of the microphone module 3, by storing the adjusted value of the power supply circuit 11 in the first memory element 16 at the time of product shipment, the bias voltage of the MEMS transducer can be accurately adjusted. In addition, at a manufacturer of the microphone 4, by storing the adjusted value of the gain adjustment circuit 15 in the second memory element 17 at the time of product shipment, gain of the microphone 4 as a whole can be accurately adjusted.

Example 2

Figure 4:
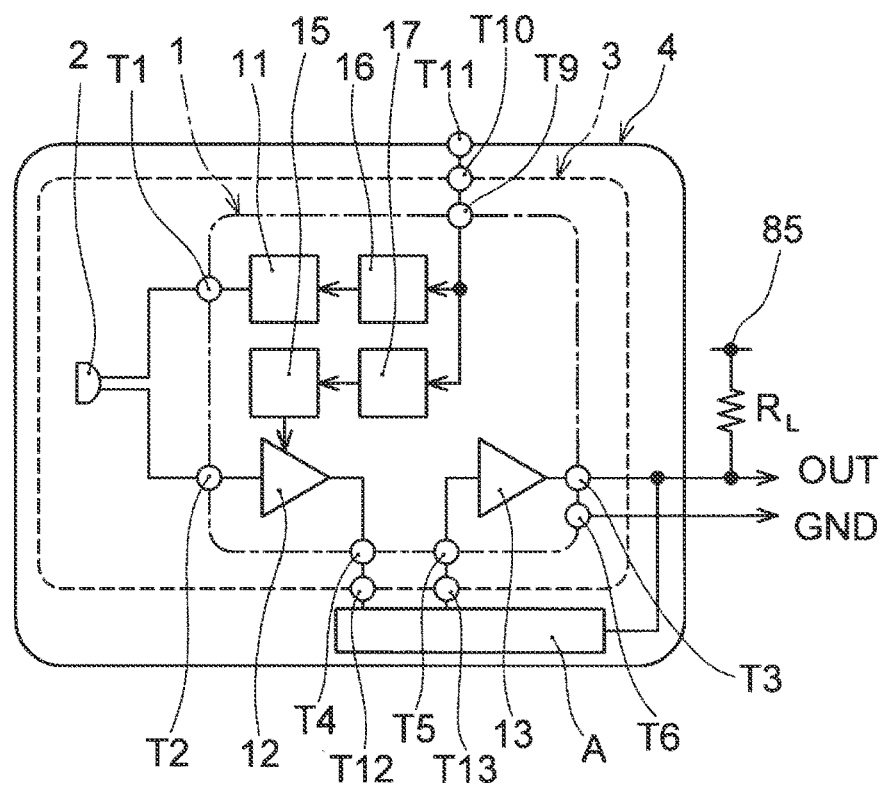
FIG. 4 is a block diagram of another basic structure in Embodiment 2.

In FIG. 4, the basic structure of FIG. 2 is provided with a gain adjustment circuit 15 for adjusting gain of the input amplifier 12, as well as a first memory element 16 for storing a voltage value optimally adjusted by a voltage adjustment circuit in the power supply circuit 11 and a second memory element 17 for storing the optimum gain adjusted by the gain adjustment circuit 15. Other configurations are the same as those in FIG. 2 or 3, and descriptions thereof are omitted.

Example 3

Figure 5:
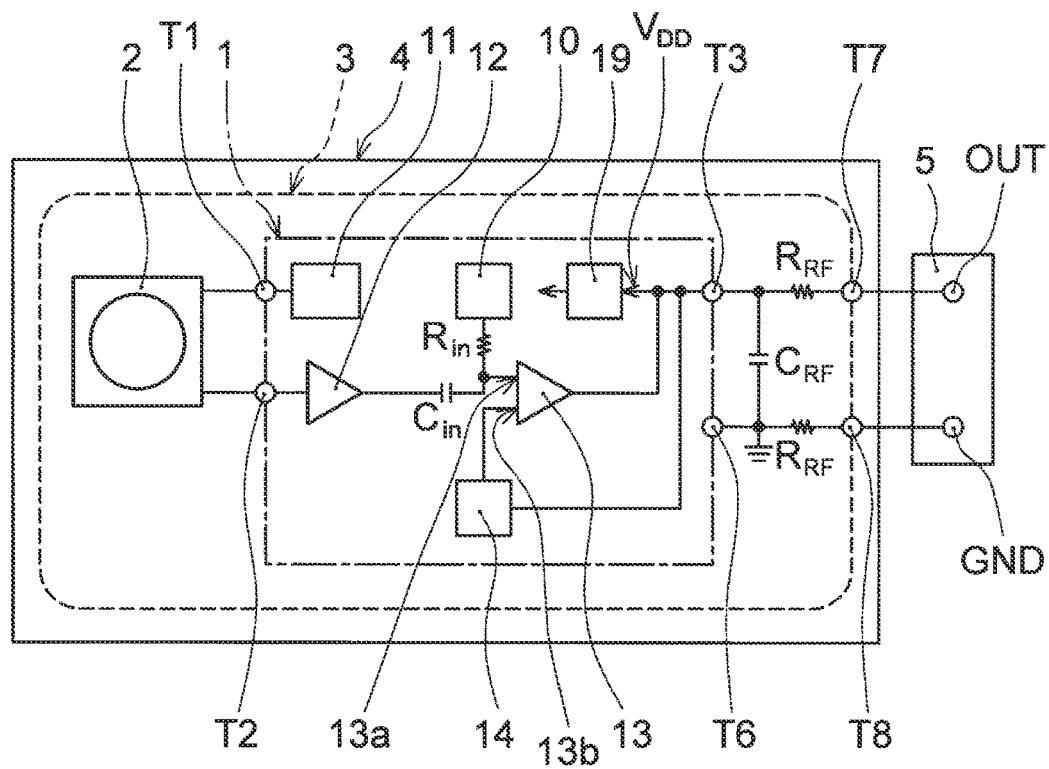
FIG. 5 is a block diagram showing a specific configuration example of FIG. 1.

FIG. 5 is a specific example of the circuit of FIG. 1. That is, a high-pass filter HPF consisting of a capacitor $C_{in}$ and a resistor $R_{in}$ is connected between the output terminal of the input amplifier 12 and the first input terminal 13a of the line driver 13, and a gain setting circuit 14 is connected between the second input terminal 13b of the line driver 13 and the output terminal T3. That is, the high-pass filter HPF removes DC components and low-frequency noise, and further, the gain setting circuit 14 adjusts gain of the line driver 13 and DC potential at the output terminal T3. This is for allowing a load to be driven depending on a load connected to the output terminal T7. Besides, the output terminal T3 is used in common with a power supply input terminal and connected to a connector 5 via the output terminal T7. A power supply $V_{DD}$ supplies power for driving each element in the semiconductor integrated circuit device 1. This power supply $V_{DD}$ from the output terminal T3 serving as the power supply input terminal is supplied via a ripple removing device 19. When adding a first memory element 16 and a second memory element 17 (not shown) (see FIG. 3), it is preferable to remove noise such as ripple in order to prevent malfunction and the like. As the ripple removing device 19, for example, a regulator circuit or a ripple filter circuit that keeps a voltage constant can be used.

Figure 10:
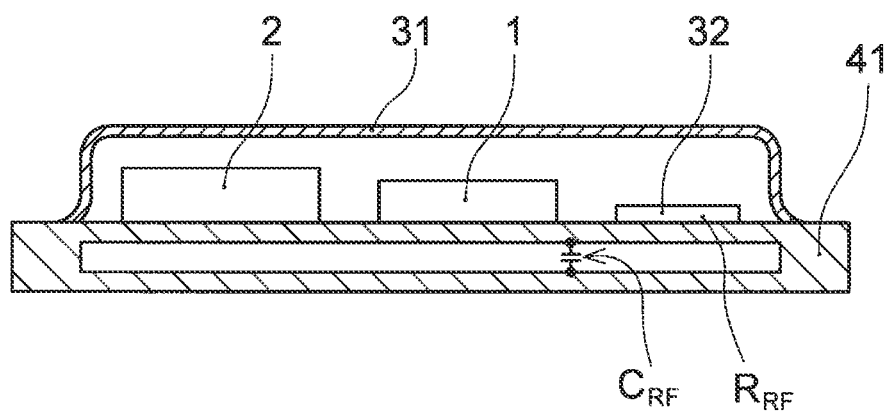
FIG. 10 is a schematic cross-sectional structural view of an example of the microphone module of the present disclosure.

A RF noise reduction filter for removing RF noise is formed between the output terminal T3 and the external terminal T6 of the GND with a capacitor $C_{RF}$ and two resistors $R_{RF}$, although it is omitted in each of the examples above. In this example shown in FIG. 5, a resistor $R_{RF}$ and a capacitor $C_{RF}$ for the RF noise reduction filter are formed inside the microphone module 3 at the outside of the semiconductor integrated circuit device 1. As a result, the semiconductor integrated circuit device 1 has a structure in which a RF noise of a desired frequency may be removed at the stage of manufacturing the microphone module 3. In the microphone module 3, as shown in FIG. 10 with its schematic sectional structure, the semiconductor integrated circuit device 1 and the MEMS transducer 2, etc. are covered with a shield cover 31. This shield cover 31 is formed of metal, or resin such as a structure in which a conductive film is formed on one surface thereof. Therefore, the RF noise reduction filter can be formed inside the shield cover 31 instead of inside the semiconductor integrated circuit device 1. That is, the aforementioned capacitor $C_{RF}$ and resistor $R_{RF}$ can also be formed within this shield cover 31. Specifically, for example, as shown in FIG. 10, adjustment can be made for a desired cutoff frequency by forming a resistor 32 functioning as a $R_{RF}$ on a substrate 41. Also, a capacitor sandwiching a dielectric body can be formed as a $C_{RF}$ in the substrate 41 or on the surface of the substrate 41, and these resistor and capacitor can also be formed of chip elements. With such a configuration, an optimum filter for removing a RF noise may be formed.

The configurations of such as the ripple removing device 19, the high-pass filter HPF, and the RF noise reduction filter shown in this example may also be applied to other embodiments and each example as needed.

Example 4

Figure 6:
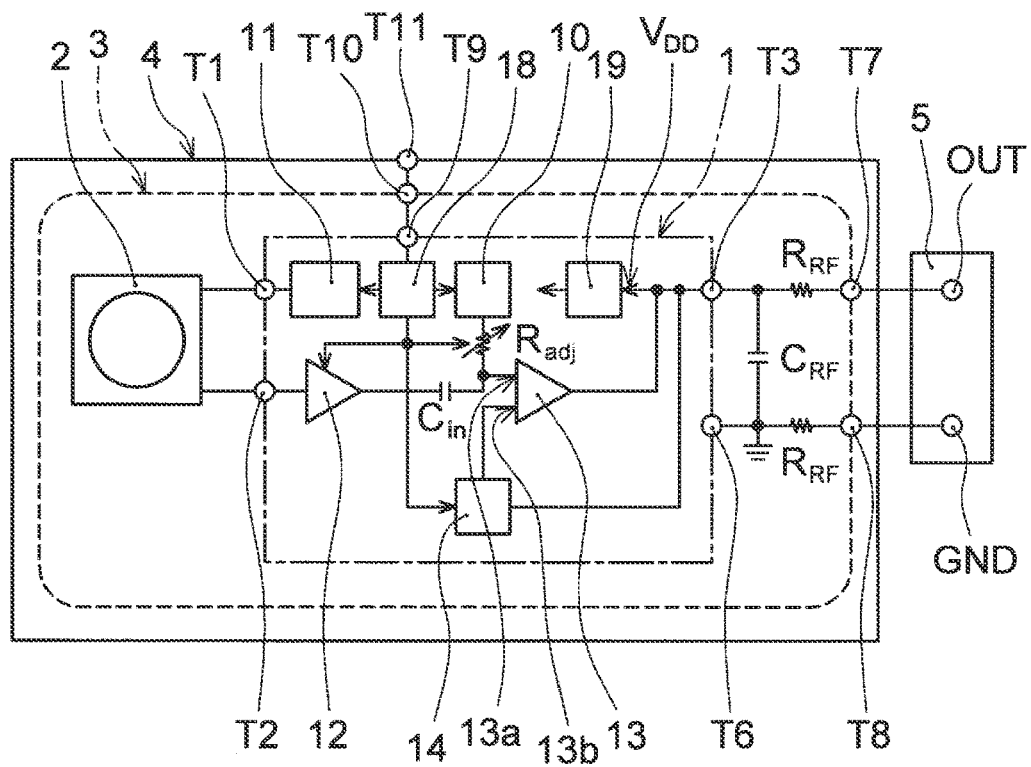
FIG. 6 is a block diagram showing a specific configuration example of FIG. 3.
Figure 8:
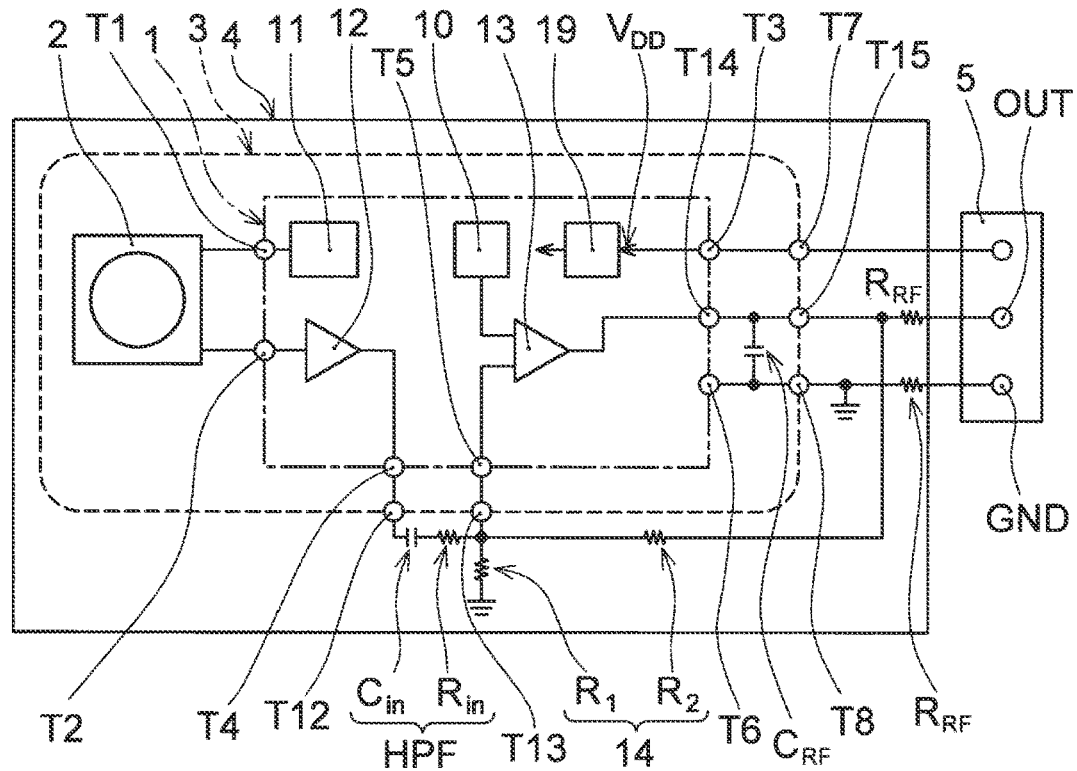
FIG. 8 is a block diagram showing another specific configuration example of FIG. 2.

FIG. 6 is a specific example of a circuit in FIG. 3, in which an OTP 18, which will be described later, is provided instead of the first memory element 16 and the second memory element 17 shown in FIG. 3. Specifically, in FIG. 6, an external terminal T11 is provided on the microphone 4 so that a resistance value of the gain setting circuit 14, an input resistance $R_{adj}$ to the line driver 13, etc. in the example of FIG. 5 can be adjusted externally via the OTP 18. That is, a memory control terminal T9 is formed on the semiconductor integrated circuit device 1 which is connected to the external terminal T10 of the microphone module 3, forming an external terminal T11 on the microphone 4. As shown in FIG. 8, etc. which will be described later, if the capacitor $C_{in}$ and resistor $R_{in}$ for the high-pass filter HPF, the first and second resistors $R_1$, $R_2$ of the gain setting circuit 14, etc. are provided outside the semiconductor integrated circuit device 1, a setting for characteristics as desired by an automobile manufacturer using, for example, an in-vehicle microphone is allowed. However, in this example, they are incorporated in the semiconductor integrated circuit device 1, and therefore, the OTP 18 is provided so that they may be adjusted even at the stage of manufacturing the microphone module 3 and even after the microphone 4 is manufactured. Other configurations are the same as the example shown in FIG. 3 or FIG. 5, and descriptions thereof are omitted.

Besides, this OTP 18 is capable of setting the gain setting circuit 14, but also, as shown in FIG. 6, making an adjustment of the output voltage of the power supply circuit 11 via the voltage adjustment circuit, making a gain adjustment of the input amplifier 12 via the gain adjustment circuit (not shown) (see 15 in FIG. 3), making an adjustment of the cutoff frequency of the high-pass filter HPF by adjusting the resistance value of the variable input resistor $R_{adj}$ for determining an input of the line driver 13, and making an adjustment of an output voltage of a reference potential generating circuit 10, which may be adjusted from the external terminal T11. A low cutoff frequency fc is obtained by $fc=1/(2\pi Cin \cdot Radj)$ [Hz]. Besides, since there is a physical limit to a capacity value of the capacitor that can be incorporated, a very high resistance is required for the input resistor $R_{adj}$, which is therefore suitably composed of SCR (Switched Capacitor Resistance).

The OTP 18 is a memory element such as a one-time programmable ROM, which can be written once. Accordingly, the adjustment value set by the gain setting circuit 14, and the like are still maintained thereafter. The structure in which this OTP 18 is provided is not limited to this example, and may be applied to other embodiments and each example. As in this example, by forming the external terminal T11 on the microphone 4, each set value can be optimized even in the state of the microphone.

Example 5

FIG. 7 is a specific circuit configuration of the example shown in FIG. 2 of Embodiment 2. That is, in this example, a portion corresponding to the external component A in FIG. 2 is composed of a high-pass filter HPF and a gain setting circuit 14, the high-pass filter HPF being formed so that the capacitor $C_{in}$ and the resistor $R_{in}$ provided between the external terminals T12 and T13 of the microphone module 3 connected to the external terminals T4 and T5 of the semiconductor integrated circuit device 1, respectively, are connected in series, removing DC components and low-frequency components of the output of the input amplifier 12.

A cutoff frequency fc of such a high-pass filter HPF in which the capacitor $C_{in}$ and the resistor $R_{in}$ are connected in series is determined by fc=1/(2πCin·Rin) [Hz]. Accordingly, at the stage of manufacturing the microphone 4, adjustment can be made so as to remove desired low-frequency components.

Furthermore, the aforementioned gain setting circuit 14 is configured by connecting the first resistor $R_1$ between the second input terminal 13b of the line driver 13 and the GND and connecting the second resistor $R_2$ between the second input terminal 13b and the output terminal T3. In this example, since the high-pass filter HPF and the gain setting circuit 14 are formed outside the microphone module 3, the gain setting circuit 14 can be adjusted depending on a load connected to the output terminal T3 at the stage of manufacturing the microphone 4. In addition, in the example shown in FIG. 7, the high-pass filter HPF and the gain setting circuit 14 are provided outside the microphone module 3, but they can be provided inside the microphone module 3 and also directly connected to the external terminals T4, T5. In this case, the high-pass filter HPF and the gain setting circuit 14 can be adjusted in the manufacturing step of the microphone module 3 and can be further covered with the shield cover (see 31 in FIG. 10), and the RF noise reduction filter can also be formed inside the microphone module 3.

In the case of the example shown in FIG. 7, since the high-pass filter HPF and the gain setting circuit 14 are formed on the substrate of the microphone 4 outside the microphone module 3, a risk of mixing noise in the gain setting circuit 14 is prevented, and therefore, the resistor $R_{RF}$ for the RF noise reduction filter that removes final high-frequency noises is also formed outside the microphone module 3. On the other hand, the capacitor $C_{RF}$ for the RF noise reduction filter is formed inside the microphone module 3 (inside the shield cover 31 (see FIG. 10) of the microphone module 3, in the example shown in the figure), and the output terminal T7 has a low impedance in a high-frequency region. In addition, the microphone 4 has a structure in which the outer periphery is covered with a housing, the housing (not shown) also being shielded, so that no RF noises enter from the outside. Accordingly, even if the resistor $R_{RF}$ for the RF noise reduction filter is formed outside the microphone module, final noise removal characteristics are maintained. From this point of view, the capacitor $C_{RF}$ for the RF noise reduction filter may also be formed outside the microphone module 3.

Example 6

FIG. 8 is a modification of the example in FIG. 7. That is, the example shown in FIG. 7 is a two-wire type line driver in which the output of the line driver 13 is output using two lines of the power supply line $V_{DD}$ and the ground line GND, but the example shown in FIG. 8 is a three-wire type line driver that outputs a signal from an output terminal T15 via an output terminal T14, dedicated for outputting, which is provided independently with an output line, in addition to the above-described two lines. As mentioned above, the three-wire type line driver outputs with the push-pull output. The push-pull output is configured by, for example, connecting a PMOS transistor between the power supply terminal $V_{DD}$ and the output OUT, and an NMOS transistor between the output OUT and the ground GND, respectively, which is not shown in the figures. By adopting a three-wire type line driver in this way, a full-swing output (large output amplitude) becomes possible with respect to the power supply ($V_{DD}$-GND). In this case, the output terminal T3 and the output terminal T7 function as power supply input terminals. In the case of the two-wire type line driver, the output amplitude becomes small in proportion to a voltage drop due to the load resistance $R_L$ shown in FIG. 1 (which is omitted in FIG. 7, but the power supply terminal 85 is connected to the output terminal T7 via the load resistance $R_L$ as in FIG. 1). Adopting which line driver depends on choice by an automobile manufacturer using the in-vehicle microphone. An example of bringing the line driver 13 into a three-wire type one is also not limited to the example in FIG. 8 and may be applied to all other embodiments and each example. The same reference numerals are given to the same parts as those in FIG. 7, and descriptions thereof are omitted.

Example 7

Figure 9:
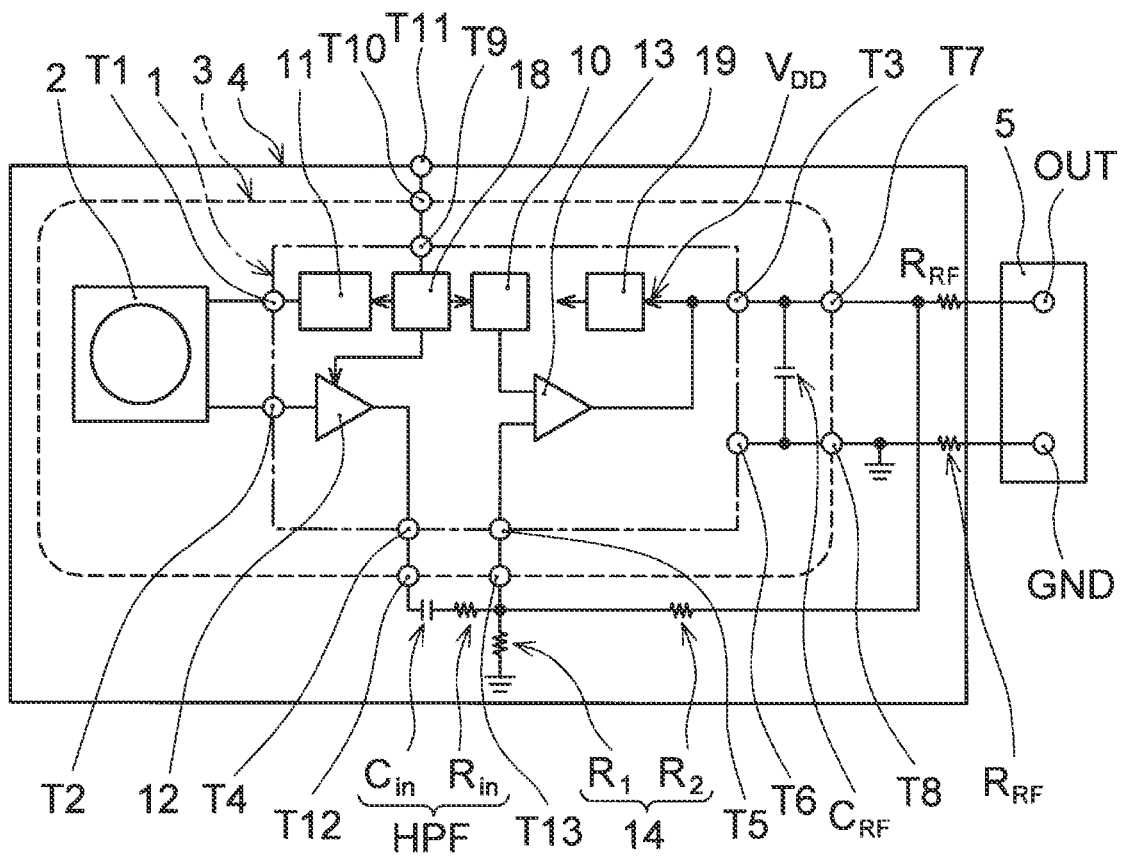
FIG. 9 is a block diagram showing a specific configuration example of FIG. 4.

The example shown in FIG. 9 is a specific example of a circuit in FIG. 4, in which the aforementioned OTP 18 is provided instead of the first memory element 16 and the second memory element 17 shown in FIG. 4. Specifically, FIG. 9 shows an example in which a high-pass filter HPF (a capacitor $C_{in}$ and a variable resistor $R_{adj}$) that is connected to the output terminal of the input amplifier 12 in the example shown in FIG. 6 is taken out of the microphone module 3, as shown in FIG. 7, and brought into an external component in FIG. 4 as an external high-pass filter HPF (a capacitor $C_{in}$ and a resistor $R_{in}$) together with the gain setting circuit 14. Since other configurations are the same as those in FIG. 6 or 7, the same reference numerals are given to the same parts, and descriptions thereof are omitted. Besides, in this example, the reference voltage $V_{ref}$ that is input to the line driver 13 may be adjusted by a program from the external terminal T11.

The adjustment of this reference voltage $V_{ref}$ that is the output voltage of the reference potential generating circuit 10 may be performed at the manufacturing stage of the microphone 4 so as to obtain an optimal midpoint potential for a variation in each component such as the high-pass filter HPF and the gain setting circuit 14 outside the microphone module 3 or a setting of the gain setting circuit 14. With the external terminal T11 being formed on the microphone 4 in this way, a variation in each part of the high-pass filter HPF and the gain setting circuit 14 formed outside the microphone module 3, a housing that is an outer wall of the microphone, or the like can also be adjusted so that desired characteristics can be obtained. This is because, for example, a housing of a hands-free microphone is made of plastic for the most part, and therefore, variations in output signal characteristics may occur due to deformation, assembling error, or the like.

As described above, the microphone module 3 is formed by mounting the semiconductor integrated circuit device 1 and the MEMS transducer 2 on the substrate, forming a high-pass filter HPF and a gain setting circuit 14 of a line driver 13 as necessary, and, as shown in FIG. 10, covering them with the shield cover 31 using metal or a resin having a conductive surface formed on the outer surface.

Furthermore, a microphone 4 that may be easily connected with a load is completed by covering the outer periphery with a housing made of resin or the like and forming a connector 5 connected to the output terminal T3 and the external terminal T6.

(Summary)

(1) In one aspect of the present disclosure, the semiconductor integrated circuit device capable of inputting a signal of a MEMS transducer comprises: a power supply circuit for the MEMS transducer; an input amplifier for inputting and amplifying a signal of the MEMS transducer; a line driver for amplifying an output from the input amplifier and allowing for driving of a load connected to an output terminal; and the output terminal for outputting an output of the line driver, wherein the power supply circuit, the input amplifier, and the line driver are integrally formed on a semiconductor substrate, and wherein a gain setting circuit for determining gain of the line driver and a DC potential of the output terminal is connected to an input terminal of the line driver.

In the present disclosure, the power supply circuit for a MEMS transducer, the input amplifier for inputting and amplifying a signal of the MEMS transducer, and the line driver are configured to be integrated into one chip semiconductor element. That is, conventionally, since it is necessary to adjust the line driver according to an external load connected to the microphone, the input amplifier and the line driver could not be integrated into one chip. However, the present disclosure has a structure that can incorporate a gain setting circuit for adjusting gain of the line driver and a DC potential of the output, so that a semiconductor integrated circuit device in which the input amplifier and the line driver are integrated into one chip is obtained. As a result, the microphone module can be made very compact, and unnecessary wiring can be eliminated, thereby suppressing exogenous noise. Furthermore, the assembly of the microphone becomes very simple, and the number of assembling steps can be greatly reduced. Therefore, a high-performance microphone with little noise can be sold at very low prices.

(2) Also, in another aspect of the present disclosure, the semiconductor integrated circuit device capable of inputting a signal of a MEMS transducer comprises: a power supply circuit for the MEMS transducer; an input amplifier for inputting and amplifying a signal from the MEMS transducer; a line driver for amplifying an output from the input amplifier and allowing for driving of a load connected to an output terminal; and the output terminal for outputting an output from the line driver, wherein the power supply circuit, the input amplifier, and the line driver are integrally formed on a semiconductor substrate, and wherein an external terminal is provided between an output terminal of the input amplifier and an input terminal of the line driver so that a filter can be connected thereto and gain of the line driver can be set externally.

The present disclosure has the same advantage as (1) above, and by forming such external terminals for external connection in the semiconductor integrated circuit device, the output of the line driver 13 can be freely adjusted depending on required characteristics in a manufacturing step of the microphone module 3 or a manufacturing step of the microphone 4. Furthermore, since the present disclosure is configured so that a filter can be connected, an influence of a RF noise, etc. can be minimized even if a circuit for setting gain of the line driver is arranged outside the semiconductor integrated circuit.

(3) In the semiconductor integrated circuit device capable of inputting a signal of a MEMS transducer disclosed in (1) above, a high-pass filter is preferably connected between the output terminal of the input amplifier and the input terminal of the line driver. This is because DC components and low-frequency noise can be removed.

(4) In the semiconductor integrated circuit device capable of inputting a signal of a MEMS transducer disclosed in (1) to (3) above, it is preferable that the semiconductor integrated circuit device further has a voltage adjustment circuit for adjusting a voltage of the power supply circuit, a first memory for storing a voltage value adjusted by the voltage adjustment circuit, a gain adjuster for adjusting gain of the input amplifier, and a second memory for storing the gain adjusted by the gain adjuster. As a result, at a manufacturer of a microphone module, the bias voltage of the MEMS transducer in which variations in characteristics easily occur due to manufacturing can be accurately adjusted. Moreover, at a manufacturer of an in-vehicle microphone, gain of the input amplifier, including variations due to the above-described various factors for variations, can be accurately adjusted. Furthermore, by adjusting the resistance value of the variable input resistor that constitutes the high-pass filter HPF and the output voltage of the reference potential generating circuit, and setting the gain setting circuit, gain of the entire microphone including variations can be accurately adjusted. By storing this adjusted voltage and the adjusted gain of the input amplifier in a memory, the setting can be easily conducted electrically without the need for physical adjustment.

(5) In the semiconductor integrated circuit device capable of inputting a signal of a MEMS transducer disclosed in (4) above, control data of the first memory and the second memory are preferably input from a common terminal. This is because an increase in the number of external terminals makes it easier for external noise to enter, but a decrease in the number of external terminals can suppress the input of exogenous noise.

(6) In the semiconductor integrated circuit device capable of inputting a signal of a MEMS transducer disclosed in (4) or (5) above, it is preferable that the semiconductor integrated circuit device further has a power supply input terminal and a ripple removing device connected between each of the first memory and the second memory and the power supply input terminal. This allows for noise from the power supply to be removed. This is because superimposing noise such as ripple, particularly on the power supply of the memory, causes malfunction.

(7) The MEMS microphone module of the present disclosure comprises a substrate, a MEMS transducer and a semiconductor integrated circuit device that are formed on the substrate, and a shield cover that covers around the MEMS transducer and the semiconductor integrated circuit device, wherein the above-described semiconductor integrated circuit device consists of the semiconductor integrated circuit device of any one of (1) to (6) above.

With this configuration, a high-performance microphone module can be manufactured very easily and at a very low cost without the need for assembling individual parts on the substrate.

REFERENCE SIGNS LIST

1. Semiconductor integrated circuit device
2. MEMS transducer
3. Microphone module
4. Microphone 10. Reference potential generating circuit
11. Power supply circuit
12. Input amplifier
13. Line driver
14. Gain setting circuit
15. Gain adjustment circuit
16. First memory element
17. Second memory element
18. OTP
19. Ripple removing device
31. Shield cover
32. Resistor
A. External component
T1, T2, T4, T5, T6, T8, T10, T11, T12, T13. External terminals
T3, T7, T14, T15. Output terminals
T9. Memory control terminal

The invention claimed is:

1. A semiconductor integrated circuit device capable of inputting a signal of a MEMS transducer, the semiconductor integrated circuit device comprising:
a power supply circuit for a MEMS transducer;
an input amplifier for inputting and amplifying a signal of the MEMS transducer;
a line driver for amplifying an output from the input amplifier and allowing for driving of a load connected to an output terminal; and
the output terminal for outputting an output of the line driver,
wherein the power supply circuit, the input amplifier, and the line driver are integrally formed on a semiconductor substrate, and
wherein a gain setting circuit for determining gain of the line driver and a DC potential of the output terminal is connected to an input terminal of the line driver.

2. A semiconductor integrated circuit device capable of inputting a signal of a MEMS transducer, the semiconductor integrated circuit device comprising:
a power supply circuit for a MEMS transducer;
an input amplifier for inputting and amplifying a signal of the MEMS transducer;
a line driver for amplifying an output from the input amplifier and allowing for driving of a load connected to an output terminal; and
the output terminal for outputting an output of the line driver,
wherein the power supply circuit, the input amplifier, and the line driver are integrally formed on a semiconductor substrate, and
wherein an external terminal is provided between the output terminal of the input amplifier and an input terminal of the line driver so as to allow for connection of a filter and external setting of gain of the line driver.

3. The semiconductor integrated circuit device of claim 1, wherein a high-pass filter is connected between the output terminal of the input amplifier and the input terminal of the line driver.

4. The semiconductor integrated circuit device of claim 1, further having a voltage adjustment circuit for adjusting a voltage of the power supply circuit, a first memory for storing a voltage value adjusted by the voltage adjustment circuit, a gain adjuster for adjusting gain of the input amplifier, and a second memory for storing the gain adjusted by the gain adjuster.

5. The semiconductor integrated circuit device of claim 4, wherein control data of the first memory and the second memory are input from a common terminal.

6. The semiconductor integrated circuit device of claim 4, further having a power supply input terminal and a ripple removing device connected between each of the first memory and the second memory and the power supply input terminal.

7. A MEMS microphone module, comprising a substrate, a MEMS transducer and a semiconductor integrated circuit device that are formed on the substrate, and a shield cover that covers around the MEMS transducer and the semiconductor integrated circuit device, wherein the semiconductor integrated circuit device is the semiconductor integrated circuit device of claim 1.

8. The semiconductor integrated circuit device of claim 2, further having a voltage adjustment circuit for adjusting a voltage of the power supply circuit, a first memory for storing a voltage value adjusted by the voltage adjustment circuit, a gain adjuster for adjusting gain of the input amplifier, and a second memory for storing the gain adjusted by the gain adjuster.

9. The semiconductor integrated circuit device of claim 3, further having a voltage adjustment circuit for adjusting a voltage of the power supply circuit, a first memory for storing a voltage value adjusted by the voltage adjustment circuit, a gain adjuster for adjusting gain of the input amplifier, and a second memory for storing the gain adjusted by the gain adjuster.

10. The semiconductor integrated circuit device of claim 5, further having a power supply input terminal and a ripple removing device connected between each of the first memory and the second memory and the power supply input terminal.

11. A MEMS microphone module, comprising a substrate, a MEMS transducer and a semiconductor integrated circuit device that are formed on the substrate, and a shield cover that covers around the MEMS transducer and the semiconductor integrated circuit device, wherein the semiconductor integrated circuit device is the semiconductor integrated circuit device of claim 2.

12. A MEMS microphone module, comprising a substrate, a MEMS transducer and a semiconductor integrated circuit device that are formed on the substrate, and a shield cover that covers around the MEMS transducer and the semiconductor integrated circuit device, wherein the semiconductor integrated circuit device is the semiconductor integrated circuit device of claim 3.

13. A MEMS microphone module, comprising a substrate, a MEMS transducer and a semiconductor integrated circuit device that are formed on the substrate, and a shield cover that covers around the MEMS transducer and the semiconductor integrated circuit device, wherein the semiconductor integrated circuit device is the semiconductor integrated circuit device of claim 4.

14. A MEMS microphone module, comprising a substrate, a MEMS transducer and a semiconductor integrated circuit device that are formed on the substrate, and a shield cover that covers around the MEMS transducer and the semiconductor integrated circuit device, wherein the semiconductor integrated circuit device is the semiconductor integrated circuit device of claim 5.

15. A MEMS microphone module, comprising a substrate, a MEMS transducer and a semiconductor integrated circuit device that are formed on the substrate, and a shield cover that covers around the MEMS transducer and the semiconductor integrated circuit device, wherein the semiconductor integrated circuit device is the semiconductor integrated circuit device of claim 6.

* * * * *